(12) United States Patent
Brox

(10) Patent No.: US 7,505,359 B2
(45) Date of Patent: Mar. 17, 2009

(54) INTEGRATED SEMICONDUCTOR MEMORY DEVICE WITH CLOCK GENERATION

(75) Inventor: Martin Brox, München (DE)

(73) Assignee: Qimonda AG, Munich (DE)

(*) Notice: Subject to any disclaimer, the term of this patent is extended or adjusted under 35 U.S.C. 154(b) by 0 days.

(21) Appl. No.: 11/749,226

(22) Filed: May 16, 2007

(65) Prior Publication Data

US 2007/0268777 A1 Nov. 22, 2007

(30) Foreign Application Priority Data

May 17, 2006 (DE) .................. 10 2006 023 173

(51) Int. Cl.
*G11C 8/00* (2006.01)
(52) U.S. Cl. .............. 365/233.1; 365/227; 365/191; 365/189.17; 365/236
(58) Field of Classification Search .......... 365/233.1, 365/227, 236, 189.17, 191
See application file for complete search history.

(56) References Cited

U.S. PATENT DOCUMENTS

| 6,166,990 A * | 12/2000 | Ooishi et al. ........... 365/233.11 |
| 2002/0039323 A1 * | 4/2002 | Tokutome et al. ........... 365/233 |
| 2003/0189868 A1 | 10/2003 | Riesenman et al. |

* cited by examiner

*Primary Examiner*—Hoai V Ho
*Assistant Examiner*—Anthan T. Tran
(74) *Attorney, Agent, or Firm*—Edell, Shapiro & Finnan, LLC

(57) ABSTRACT

A memory device can be operated in a first operating state and a second operating state, where read access to memory cells can be performed in the first operating state. The memory device includes an activatable clock generator circuit to generate a clock signal. The clock generator circuit can be operated in an activated state, in which it generates the clock signal, and in a deactivated state, in which generation of the clock signal is suppressed. The activatable clock generator circuit is operated in the activated state at a time period after changeover of the memory device from the first operating state to the second operating state, and is changed over from the activated state to the deactivated state no later than after the period has elapsed.

21 Claims, 5 Drawing Sheets

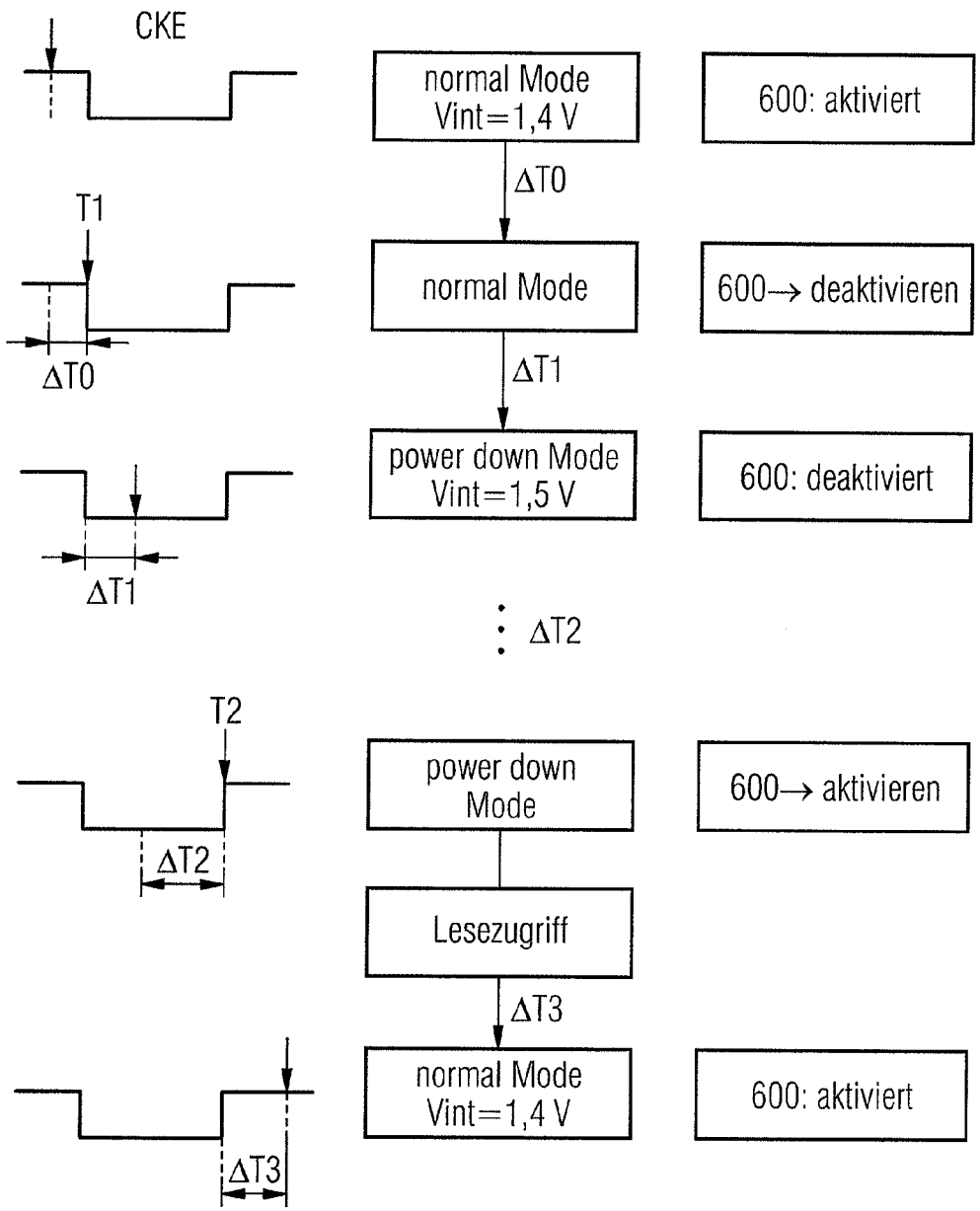

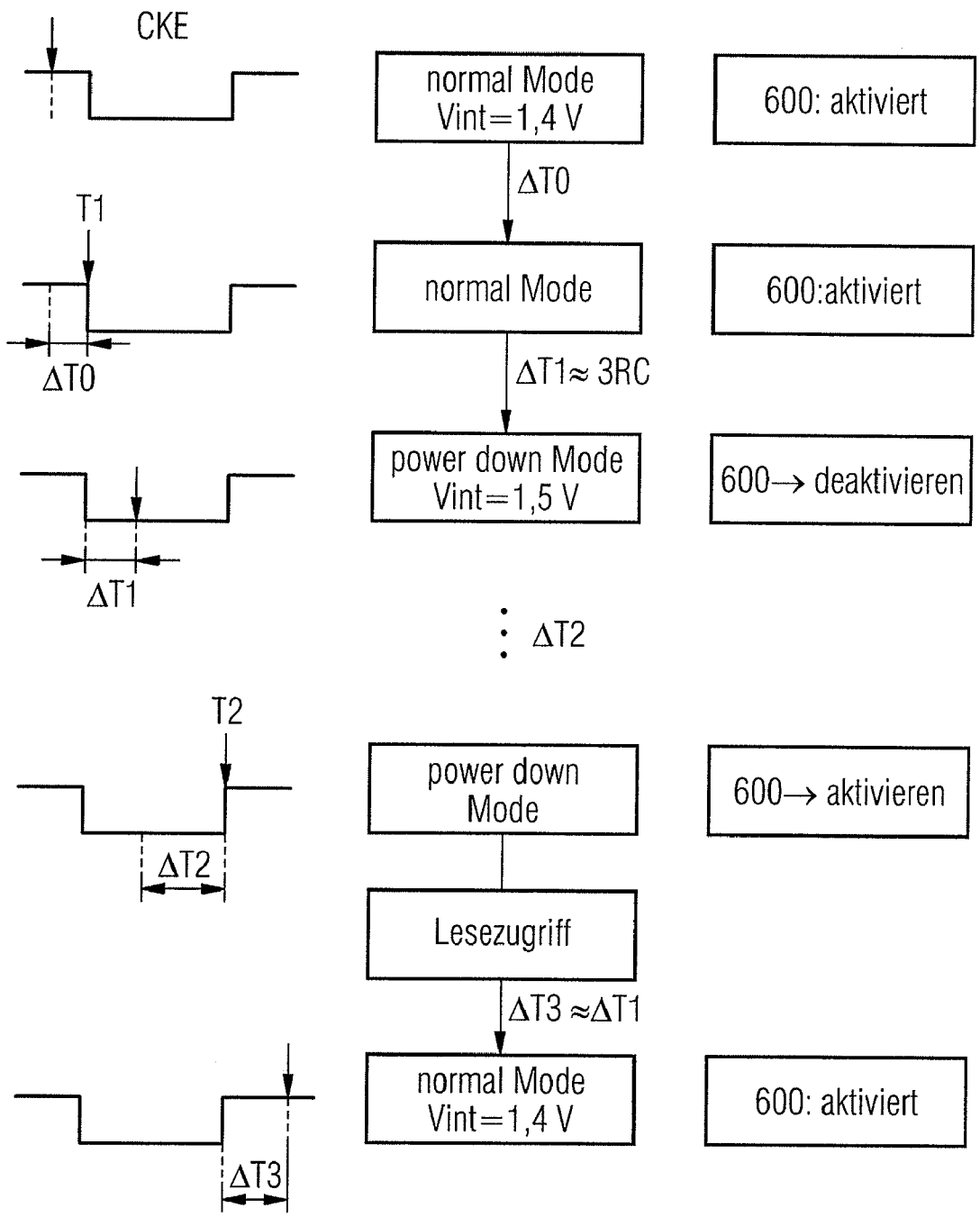

INTEGRATED SEMICONDUCTOR MEMORY DEVICE WITH CLOCK GENERATION

CROSS REFERENCE TO RELATED APPLICATIONS

This application claims priority under 35 U.S.C. §119 to Application No. DE 102006023173.2 filed on May 17, 2006, entitled "Integrated Semiconductor Memory with Clock Generation," the entire contents of which are hereby incorporated by reference.

BRIEF DESCRIPTION OF THE DRAWINGS

Embodiments of the invention are explained in detail below with reference to the figures, in which:

FIG. 3 shows a changeover operation in the event of an integrated semiconductor memory changing over between an active operating state and a power-saving operating state, FIG. 6 shows a changeover operation in the event of an integrated semiconductor memory changing over between an active operating state and a power-saving operating state.

DETAILED DESCRIPTION

Figure 1:
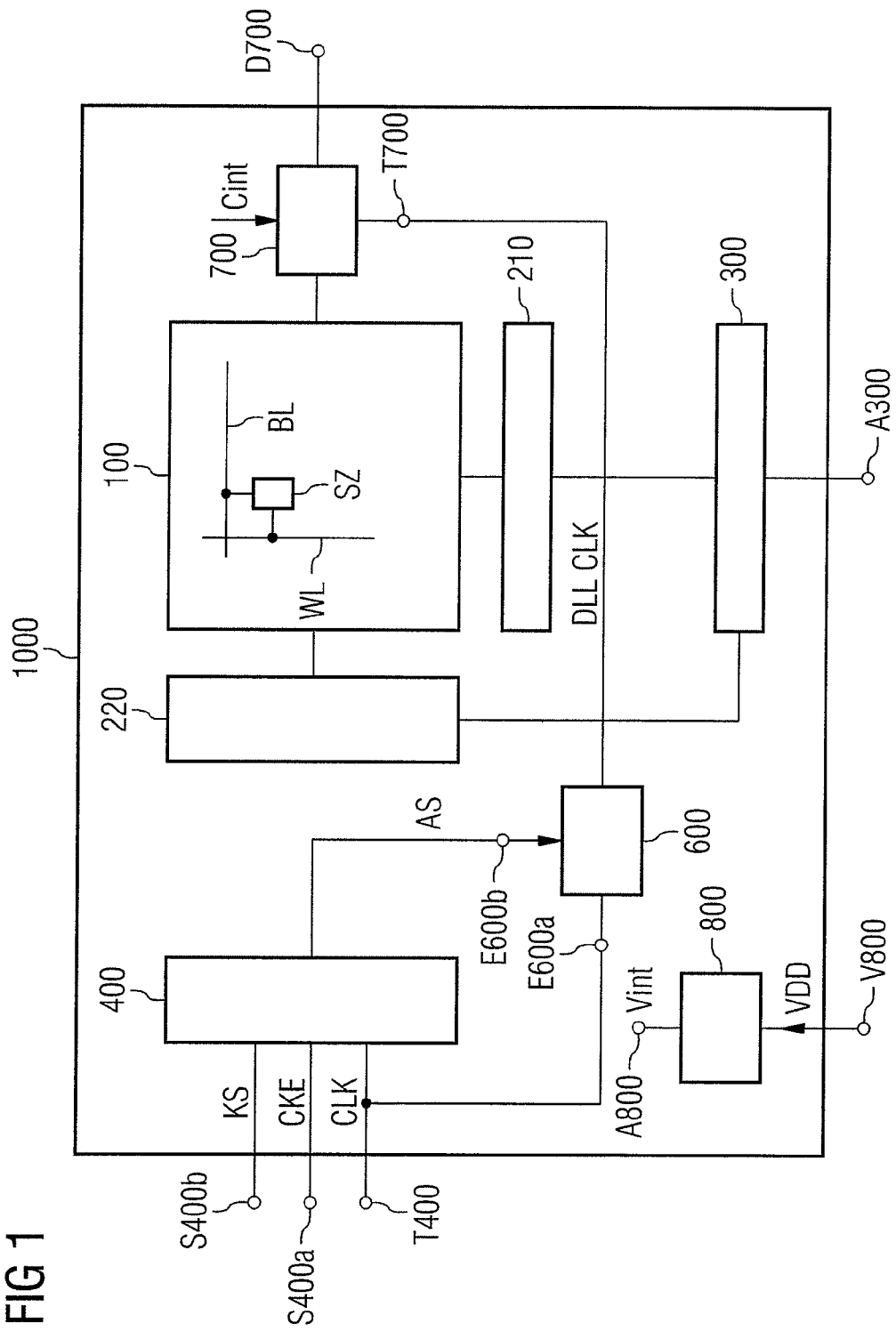
FIG. 1 shows an integrated semiconductor memory device with internal clock generation for the clock-synchronous output of data.

FIG. 1 shows an integrated semiconductor memory device 1000 with a memory cell array 100 which contains memory cells SZ along word lines WL and bit lines BL. In the event of read access to one of the memory cells, a read command KS is applied to a control connection S400b of a control circuit 400. In addition, to select one of the memory cells for the read access, a word line address and a row address are applied to an address connection A300, the addresses respectively being buffer-stored in an address register 300. The word line address is decoded by a word line decoder 210. The row address is decoded by a row decoder 220. On the basis of the decoded word and row addresses, the word line decoder 210 selects one of the word lines WL and the row decoder 220 selects one of the bit lines BL for the read access. Hence, that memory cell which is arranged at the crossover point for the selected word line and the selected bit line is selected for the read access. The read access takes place in sync with a clock signal CLK which is applied to a clock connection T400 of the integrated semiconductor memory device.

All the circuit components of the integrated semiconductor memory device are operated in sync with internal clock signals which are generated by clock generator circuits on the memory chip of the integrated semiconductor memory device, the internal clock signals being derived from the external clock signal CLK. For the sake of simplicity, FIG. 1 shows only one clock generator circuit 600, whose output generates an internal clock signal DLLCLK which is coupled to the external clock signal CLK in phase-locked fashion. The external clock signal CLK is supplied to the clock generator circuit 600 on an input connection E600a. The internal clock signal DLLCLK is supplied to a clock connection T700 of an output unit 700 which is in the form of a memory circuit, for example.

In the event of read access, the data which are read from the memory cell array are buffer-stored in the memory circuit 700 and from there are supplied to a data connection D700. The memory circuit 700 is generally in the form of an FIFO (First In First Out) memory. Data from the memory cell array are read into the FIFO memory in sync with a further internal clock signal Cint, which is provided by a clock generation unit (not shown in FIG. 1), and are output on the data connection D700 in sync with the internal clock signal DLLCLK. Since the internal clock signal DLLCLK is in sync with the external clock signal CLK and is coupled to it in phase-locked fashion, the data output on the data connection D700 takes place in sync with the external clock signal CLK. This ensures that a receiver circuit which is connected to the data connection D700 can process the generated data further in sync with the external clock signal CLK.

For the purpose of supplying current/power to circuit components in the integrated semiconductor memory device, a supply voltage Vint is provided on an output connection A800 of a voltage generator circuit 800. The voltage generator circuit generates the supply voltage Vint as a stabilized voltage from a voltage VDD which is supplied to its input. It is also possible for the supply voltage for the circuit components of the integrated circuit to be supplied directly from outside without regulation. If there is no read or write access to the integrated semiconductor memory device for a relatively long time, the integrated semiconductor memory device can be switched from an active operating state (normal mode) to a power-saving mode (power-down mode). The changeover from the active operating state to the power-down operating state is indicated to the control circuit 400 by applying a state change in a control signal CKE to a control connection S400a. Since no read or write access is being effected to memory cells in the memory cell array 100 in the power-down operating state, the power consumption of individual circuit components in the integrated semiconductor memory is reduced in the power-down operating state.

Charge reversal operations in the clock generator circuits of a memory chip give rise to considerable power consumption. To reduce the memory's power consumption in the power-down operating state, conventional memories therefore involve the internal clock signals for actuating control circuits, for actuating data paths and particularly also the internal clock signal DLLCLK generated by the clock generator circuit 600 for the purpose of data output being turned off. Since all the internal clock generator circuits have been stopped, the remaining power consumption is essentially independent of the external clock signal from which the internal clock signals are derived.

Figure 2:
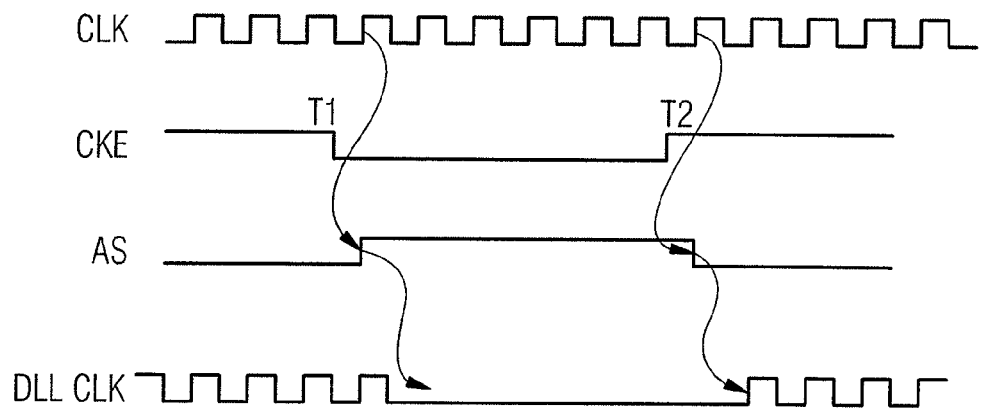
FIG. 2 shows a signal state diagram for an integrated semiconductor memory in the event of a change between an active operating state and a power-saving operating state.

FIG. 2 shows a signal state diagram for signals when the internal clock signal DLLCLK is turned off. First, the internally generated clock signal DLLCLK is coupled to the external clock signal CLK. While the external clock signal CLK is continuously applied to the clock connection T400, a falling edge of the control signal CKE at time T1 causes the integrated semiconductor memory to change over from the active operating state to the power-down operating state. When the control circuit 400 is actuated by the state change in the control signal CKE at time T1, it generates a high level for an activation signal AS, which is supplied to an input connection E600b of the clock generator circuit 600, a short time later upon a next rising edge of the external clock signal CLK. The clock generator circuit 600 is then deactivated and generation of the clock signal DLLCLK is suppressed.

From time T2 onward, read and write access to the integrated semiconductor memory takes place again. To this end, a state change in the control signal CKE is again applied to the control connection S400a at time T2. Upon the next rising edge of the external clock signal CLK, the control circuit 400 generates a falling edge for the activation signal AS, and this edge is used to actuate the clock generator circuit 600. As a result of the falling edge in the activation signal AS, the clock generator circuit 600 is activated again, so that the internal clock signal DLLCLK is generated again.

The clock generator circuit 600 is generally in the form of a delay locked loop circuit which couples the internal clock signal DLLCLK to the external clock signal CLK in phase-locked fashion. In the activated state, the DLL circuit 600 is locked to the external clock signal CLK and tracks the internal clock signal DLLCLK it generates at its output to the external clock signal CLK. In the deactivated state, the clock generator circuit 600 remains matched to the last locked state of the external clock signal or to the operating state in which the integrated semiconductor memory was at the time at which the clock generator circuit was turned off. Since it is no longer locked, no further matching takes place in respect of changes in the external clock frequency or in respect of voltage changes on the semiconductor memory's memory chip, for example.

FIG. 3 illustrates read access which takes place directly after the end of a power-down operating state. First, a high level of the control signal CKE is applied to the control connection S400a. The integrated semiconductor memory is therefore in the active operating state (normal mode), in which read and write access takes place. On account of the power consumption of the circuit components in the integrated semiconductor memory as a result of the read and write access taking place in the active operating state, the internal supply voltage Vint on the output connection A800 of the voltage generator circuit 800 is slightly reduced in comparison with the power-down operating state to a level Vint=1.4 V. At this stage, the clock generator circuit 600 is still in an active state. It is locked to the external clock signal CLK and is matched to state changes in the semiconductor memory.

After a period ΔT0, the integrated semiconductor memory is switched to the power-down operating state. To this end, the control signal CKE is applied with a falling edge to the control connection S400a at time T1. The clock generator circuit 600 is then deactivated by the control circuit 400 by actuation with an appropriate state of the activation signal AS. The clock generation of the clock signal DLLCLK is now turned off. The clock generator circuit remains matched to the last locked state.

After a period ΔT1, changes in the on-chip voltages on the memory chip have died down and the integrated semiconductor memory device is in a stable power-down operating state. In the power-down operating state, the power consumption of the circuit components integrated on the memory chip is reduced, since no read and write access is taking place. The lower power consumption means that the voltages Vint generated by the voltage generator circuit 800 are slightly increased in comparison with the active operating state and are 1.5 V, for example. At this time, the clock generator circuit 600 is already in the deactivated state.

After a longer period ΔT2, the integrated semiconductor memory is changed over from the power-down operating state back to the active operating state by a state change in the control signal CKE. Following actuation of the control connection S400a with a rising edge of the control signal CKE at time T2, the control circuit 400 activates the clock generator circuit 600 in order to generate the internal clock signal DLLCLK. After a period ΔT3, the integrated semiconductor memory is in a stable active operating state again. The on-chip voltages Vint are reduced by 0.1 volt in comparison with the power-down operating state on account of the increased power consumption of the circuit components in the integrated semiconductor memory, and in the present example are approximately 1.4 volts again. The clock generator circuit 600 is in an active operating state. In this context, it is permanently matched to state changes in the semiconductor memory and is locked to the external clock signal CLK.

If read access is effected directly after the end of the power-down operating state, before the period ΔT3 has elapsed, then the integrated semiconductor memory is still initially in a state in which the on-chip voltages Vint are still at the increased level of 1.5 volts. However, directly after being turned on, the clock generator circuit 600 is matched to the operating state which existed when the clock generator circuit was deactivated. This is the state of the semiconductor memory at time T1, at which the semiconductor memory was in a stable active operating state. Since this operating state is not reached again until after the period ΔT3 has elapsed, the clock generator circuit is matched to an incorrect operating state of the integrated semiconductor memory device in the event of read access which is effected directly after the end of the power-down operating state. The output of data is therefore no longer in sync with the external clock signal CLK. Since receiver circuits which are connected to the data connection D700 expect data in sync with the external clock signal CLK, however, malfunctions are unavoidable.

In one embodiment of the integrated semiconductor memory device, the semiconductor memory can be operated in a first and a second operating state, where, in contrast to the second operating state, read access to memory cells can be performed only in the first operating state. The integrated semiconductor memory device comprises an activatable clock generator circuit that generates a clock signal, which clock generator circuit can be operated in an activated state, in which it generates the clock signal, and can be operated in a deactivated state, in which generation of the clock signal is suppressed. In addition, the integrated semiconductor memory device comprises an activation circuit for activating/deactivating the activatable clock generator circuit and an output unit for outputting data stored in the memory cells with an output connection for outputting the stored data and with a clock connection for applying the clock signal, where the stored data are generated by the output unit on the output connection in sync with the clock signal. The activation circuit is in a form such that it switches the activatable clock generator circuit to the activated state a period after changeover of the integrated semiconductor memory from the first to the second operating state and it changes over the activatable clock generator circuit from the activated state to the deactivated state no later than after the period has elapsed.

When the integrated semiconductor memory is operated in the second operating state, the memory is in a power-down operating state in which no read access to memory cells in the semiconductor memory takes place. In the second operating state, the memory cells are merely refreshed. The activatable clock generator circuit generates a clock signal which is used to read data, which are read from the memory cell array and are buffer-stored in the memory circuit, in sync with an external clock signal on the output connection of the semiconductor memory. To reduce the power consumption of the semiconductor memory device, the activatable clock generator circuit is deactivated in the second operating state of the integrated semiconductor memory, since in the power-down operating state no data are read from the memory cell array and hence the clock signal generated by the activatable clock generator circuit is not required.

In accordance with the invention, the activatable clock generator circuit is not deactivated directly after changeover of the integrated semiconductor memory from the first operating state, in which read access to memory cells takes place, to the second operating state (power-down operating state), but rather no later than after a defined period has elapsed after the changeover operation. This allows the activatable clock generator circuit to remain still locked at first after the changeover from the first to the second operating state and to match the operating conditions in the second operating state of the semiconductor memory device. Since no read access takes place in the second operating state and hence circuit components of the memory also have only a reduced power consumption, the on-chip voltages which are present on the memory chip are increased in comparison with the first operating state, for example. In the event of read access which takes place directly after the changeover from the second operating state to the first operating state, the semiconductor memory still has the operating conditions of the power-down operating state at first. Since the activatable clock generator circuit is currently matched to these conditions, however, the read access can take place as intended. The data which are read are therefore generated in sync with the external clock signal on the output connection of the semiconductor memory.

Since no read access to memory cells takes place in the second operating state, the internal power consumption of circuit components on the memory chip of the integrated semiconductor memory is reduced. This means that the on-chip voltages in the second operating state are increased, in general, in comparison with the first operating state.

The period after which the activatable clock generator circuit is deactivated preferably corresponds to three times the RC constant of the memory chip, where the resistance R indicates the package and on-chip wiring resistance of the on-chip voltage networks and the capacitance C indicates the buffer capacitances of the on-chip voltage networks. When this period has elapsed, transient currents and voltages which occur when the semiconductor memory changes over from the first to the second operating state have died down, so that the semiconductor memory is in a stable state again. As the data value of the data signal, the value of the external clock signal's period duration is therefore preferably applied to the input connection for applying the data signal. On the basis of the period duration of the external clock signal, the programming circuit generates the value of a multiplier by which the value of the period duration is multiplied within the programming circuit. The result of the multiplication gives the value of the second counter reading. This ensures that the period after which the activatable clock generator circuit is deactivated at the latest corresponds with a defined constant period, for example three times the RC constant of the voltage networks in the memory chip.

Figure 4:
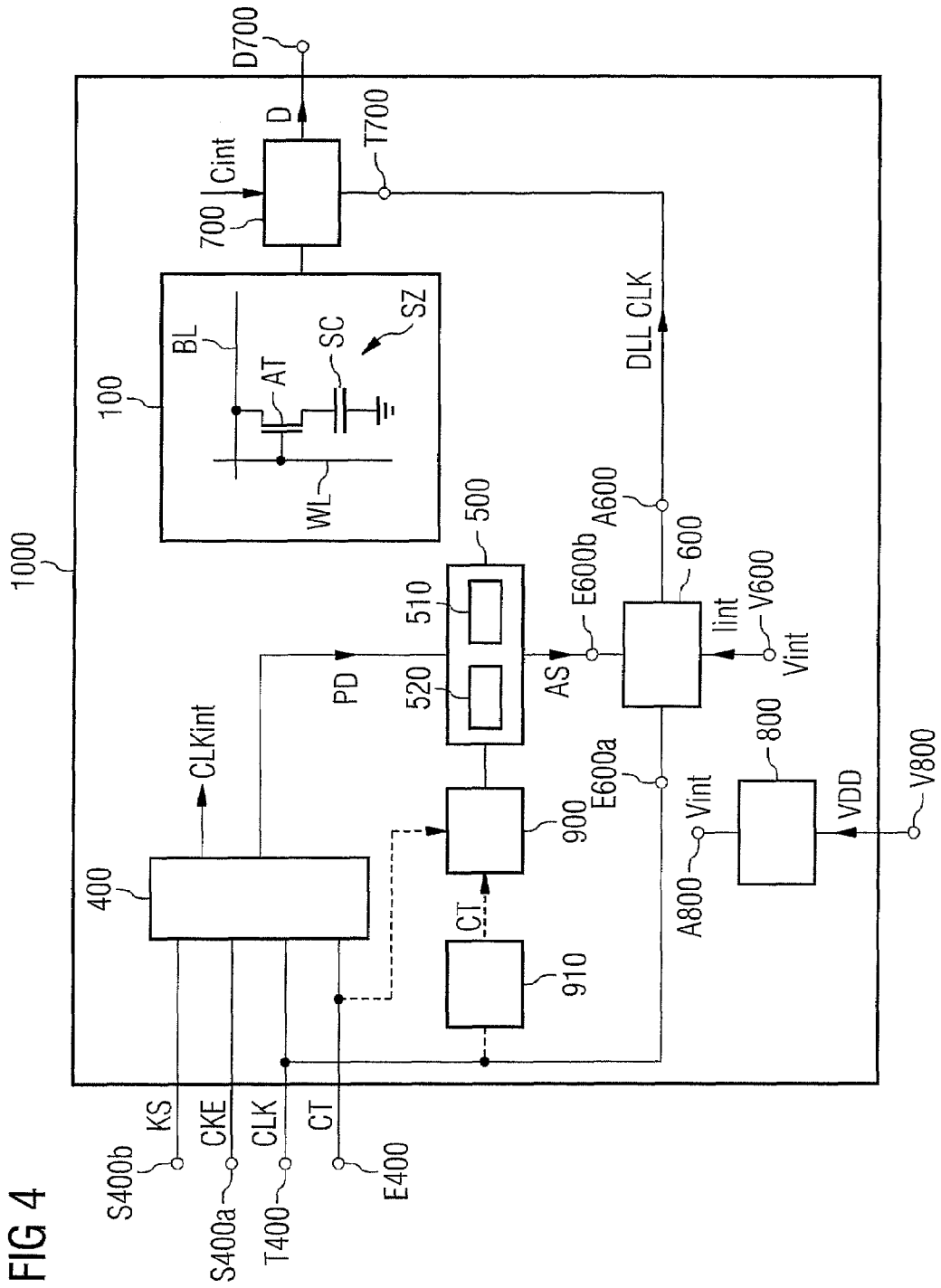
FIG. 4 shows an embodiment of an integrated semiconductor memory device with activation/deactivation of an activatable clock generator circuit for generating an internal clock signal.

FIG. 4 shows an integrated semiconductor memory device 1000 with the memory cell array 100 already shown in FIG. 1, with the control circuit 400, with the activatable clock generator circuit 600, with the voltage generator circuit 800 and with the output unit 700, which is in the form of a memory circuit, for example. For clarity purposes, the address register 300, the column decoder 210 and the row decoder 220 have not been shown. The memory cell arranged in the memory cell array 100 is in the form of a DRAM (Dynamic Random Access Memory) memory cell. It comprises a selection transistor AT and a storage capacitor SC. In the event of the memory cell SZ being selected for read access, the selection transistor AT is switched to an on state by an appropriate signal on the word line WL, so that the storage capacitor SC is connected at low impedance to the bit line BL in order to read its memory state. In addition, the integrated semiconductor memory device 1000 comprises an activation circuit 500 which is connected between the control circuit 400 and the activatable clock generator 600.

Figure 5:
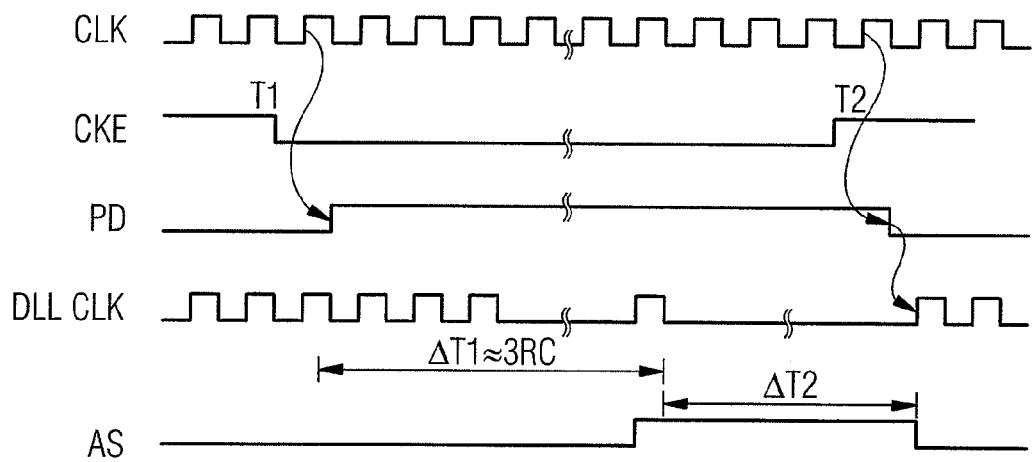
FIG. 5 shows a signal state diagram for an integrated semiconductor memory in the event of a change between an active operating state and a power-saving operating state.

The way in which the integrated semiconductor memory in FIG. 4 works is explained with reference to the signal state diagram in FIG. 5. At a time T1, the integrated semiconductor memory is switched from the active operating state to the power-saving operating state. To this end, a state change in the control signal CKE is applied to the control connection S400a. Upon the next rising edge of the external clock signal CLK, the control circuit 400 actuates the activation circuit 500 with a state change in a control signal PD.

Following the state change in the control signal PD, the activatable clock generator circuit 600 continues to generate the clock signal DLLCLK at least for a period $\Delta T1$. In this context, the period $\Delta T1$ is approximately 3*R*C and hence approximately three times the RC constant of the integrated semiconductor memory device, where R indicates the resistance value of the package and on-chip wiring resistances of the voltage networks on the chip and C indicates the capacitance value of buffer capacitances in the on-chip voltage networks. Typical values for the RC constant of an integrated semiconductor memory are approximately 100 nanoseconds for a resistance of $R=0.1\Omega$ and a capacitance of $C=1 \mu F$. After approximately 300 nanoseconds, transient currents and voltages during the state change in the integrated semiconductor memory device from the active operating state to the power-saving operating state have died down to such an extent that the integrated semiconductor memory device is in a stable power-down operating state.

Only then does the activation circuit 500 generate, in accordance with the invention, a rising edge of the activation signal AS which is supplied to the input connection E600b of the activatable clock generator circuit 600. The activatable clock generator circuit 600 is then deactivated, so that generation of the internal clock signal DLLCLK is suppressed. By deactivating the activatable clock generator circuit 600, the power consumption of the integrated semiconductor memory is significantly reduced in the power-saving operating state. The activatable clock generator circuit 600 matches the operating state of the integrated semiconductor memory device which existed when the activatable clock generator circuit was deactivated. It therefore matches the stable power-down operating state with on-chip voltages of approximately 1.5 volts.

At time T2, the integrated semiconductor memory device is activated to perform read and write access again. To this end, the control connection S400a is actuated with a rising edge of the control signal CKE. Upon the next rising edge of the external clock signal CLK, the control circuit 400 then actuates the activation circuit 500 with a falling edge of the control signal PD. Upon the next rising edge of the external clock signal CLK, the activation circuit 500 generates a falling edge of the activation signal AS, which activates the activatable clock generator circuit 600 to generate the internal clock signal DLLCLK.

FIG. 6 shows the states of the activatable clock generator circuit 600 in the event of a change between an active operating state (normal mode) of the integrated semiconductor memory and a power-saving operating state (power-down). In the active operating state, the activatable clock generator circuit 600 has been activated. The on-chip voltages Vint are approximately 1.4 volts on account of the power consumption of circuit components in the integrated semiconductor memory device. The activatable clock generator circuit 600 matches this voltage state of the integrated semiconductor memory device and is locked to the external clock signal CLK applied to the clock connection T400. Its output generates the internal clock signal DLLCLK in phase-locked fashion with respect to the externally applied clock signal CLK.

At time T1, the integrated semiconductor memory is switched from the active operating state to the power-saving operating state. In contrast to FIG. 3, the activatable clock generator circuit 600 continues to remain in the active state at first. After a period $\Delta T1 \approx 3*R*C$, after which transient currents and voltages on the chip have died down, the on-chip voltages are approximately 1.5 volts. Since, in contrast to the active operating state of the integrated semiconductor memory device, no more memory access takes place and hence the power consumption of the circuit components on the memory chip is reduced, the on-chip voltages Vint are increased by 0.1 volt in comparison with the active operating state. Since the activatable clock generator circuit continues to be activated, it is matched to the stable power-down operating state. Only now does deactivation take place.

The activatable clock generator circuit remains deactivated during a period $\Delta T2$. At time T2, the power-down operating state is terminated. The activatable clock generator circuit 600 is activated again at this time. After the state change, the integrated semiconductor memory is back in a stable active operating state after a period $\Delta T3$ which corresponds approximately to the period $\Delta T1$ of three RC constants. The on-chip voltages are reduced by 0.1 volt in comparison with the power-down operating state and are again approximately 1.4 volts.

When read access takes place directly after time T2, the integrated semiconductor memory device is at first still in the operating conditions of the power-down operating state. In particular, the on-chip voltages Vint have not yet been reduced to the stable state of 1.4 volts. Since the activatable clock generator circuit has not been deactivated until after a period $\Delta T1$ after the changeover from the active operating state to the power-down operating state and hence matches the power-down operating state, it matches the currently valid operating state of the integrated semiconductor memory after the clock generator circuit has been activated at time T2. This means that read access taking place directly after the changeover from the power-down operating state to the active operating state can be executed in sync with the external clock signal CLK.

Specific exemplary embodiments of the integrated semiconductor memory device are described below with reference to FIG. 4. The activation circuit 500 comprises a counter circuit 510 and a memory circuit 520 for storing a counter reading. In the event of a state change in the control signal PD, the counter circuit 510 is activated and alters an internal counter reading until the counter reading stored in the memory circuit 520 has been reached. The activation signal AS is then generated, which deactivates the activatable clock generator circuit 600.

To store the final counter reading of the memory circuit 520, a programming circuit 900 is provided. The programming circuit 900 is actuated by a data signal CT, which is applied to an input connection E400 of the integrated semiconductor memory device, with a data value. The data value of the data signal CT preferably indicates the duration of a clock period of the clock signal CLK. Within the programming circuit 900, the final counter reading is ascertained by multiplying the data value of the data signal CT by a variable value. In this case, the variable value is generated on the basis of the data value of the data signal CT in the programming circuit 900. This ensures that the period $\Delta T1$ has an approximate period of three RC constants of the integrated semiconductor memory regardless of the frequency or the applied clock signal's clock period which has been read in.

In another embodiment, the period duration of the applied external clock signal is not prescribed via an input connection E400 but rather is ascertained by a frequency detector 910. To this end, the frequency detector is supplied with the external clock signal CLK at its input. The output of the frequency detector 910 generates the data signal CT with a data value which indicates the period duration of the external clock signal CLK. On the basis of the frequency ascertained by the frequency detector or the ascertained period duration, the programming circuit 900 generates a multiplier which is multiplied by the ascertained period duration. This ensures, even in this case, that the final counter reading has a value which means that the activatable clock generator circuit is not deactivated until after approximately three RC constants of the integrated semiconductor memory.

While specific embodiments have been described in detail in the foregoing detailed description and illustrated in the accompanying drawings, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

What is claimed:

1. A memory device that is operable in a first operating state and a second operating state, with read access to memory cells of the memory device being facilitated in the first operating state, the memory device comprising:

an activatable clock generator circuit configured to generate a clock signal in an activated state and to suppress generation of the clock signal in a deactivated state;

an activation circuit to switch the activatable clock generator circuit between the activated and deactivated states;

an output unit configured to output data stored in the memory cells of the memory device, wherein stored data are output by the output unit in sync with the clock signal; and a control connection configured to apply a first state or a second state of a control signal, wherein the memory device is operable in the first operating state when the control connection applies the control signal in the first state, and the memory device is operable in the second operating state when the control connection applies the control signal in the second state;

wherein the activation circuit is configured to switch the activatable clock generator circuit between activated and deactivated states such that the activatable clock generator circuit operates in the activated state during a time period that is after the memory device has changed from the first operating state to the second operating state, and such that the activatable clock generator circuit is changed from the activated state to the deactivated state after the time period has elapsed, and the activation circuit comprises a counter circuit with a counter reading, the activation circuit being configured to alter the counter reading from a first counter reading until the counter reading has reached a second counter reading after the control connection applies the control signal in the second state, and the activation circuit further being configured to switch the activatable clock generator circuit to the deactivated state when the counter reading of the counter circuit has reached the second counter reading.

2. The memory device of claim 1, wherein the activation circuit is configured to control the activatable clock generator circuit such that the activatable clock generator circuit is changed from the deactivated state to the activated state after the memory device changes from the second operating state to the first operating state.

3. The memory device of claim 1, wherein the activatable clock generator circuit includes a supply connection to provide a supply voltage to the activatable clock generator circuit, the supply voltage having different levels at the first and second operating states of the memory device.

4. The memory device of claim 3, wherein the supply voltage in the second operating state has a higher level than the supply voltage in the first operating state of the memory device.

5. The memory device of claim 1, wherein the output unit comprises a memory circuit to store data.

6. The memory device of claim 3, further comprising a voltage generator circuit configured to generate the supply voltage and provide the supply voltage to the supply connection of the activatable clock generator circuit.

7. The memory device of claim 1, wherein the activation circuit further comprises a memory circuit to store the second counter reading.

8. The memory device of claim 7, further comprising:
an input connection to apply a data signal with a data value; and
a programming circuit to program the second counter reading into the memory circuit in the activation circuit, wherein the programming circuit is configured to program the second counter reading into the memory circuit in the activation circuit based upon the data value of the data signal.

9. The memory device of claim 7, further comprising a clock connection to apply an external clock signal, wherein the activatable clock generator circuit is connected to the clock connection to receive the external clock signal, and the activatable clock generator circuit is configured to generate the clock signal in sync with the external clock signal and to supply the clock signal to the output unit.

10. The memory device of claim 9, further comprising:
a programming circuit to program the second counter reading into the memory circuit in the activation circuit;
a frequency detector connected to the clock connection and configured to detect a frequency of the external clock signal;
wherein the programming circuit is connected to the frequency detector and is configured to program the second counter reading into the memory circuit based upon the frequency of the external clock signal determined by the frequency detector.

11. The memory device of claim 1, further comprising a memory cell away with memory cells, wherein the memory cell away is connected to the output unit and the output unit is configured to buffer-store a data item that has been read from a memory cell of the memory cell array.

12. The memory device of claim 1, wherein the memory device comprises an integrated semiconductor memory device.

13. A memory device that is operable in a first operating state and a second operating state, with read access to memory cells of the memory device being facilitated in the first operating state, the memory device comprising:

an activatable clock generator circuit configured to generate a clock signal in an activated state and to suppress generation of the clock signal in a deactivated state, wherein the activatable clock generator circuit is operable in the activated state during a time period that is after a change of the memory device from the first operating state to the second operating state, and the activatable clock generator circuit is operable so as to be switched from the activated state to the deactivated state after the time period has elapsed; and
an activation circuit to switch the activatable clock generator circuit between the activated and deactivated states, wherein the activation circuit comprises a counter circuit with a counter reading, the activation circuit is configured to alter the counter reading from a first counter reading until the counter reading has reached a second counter reading after a switch of the memory device from the first operating state to the second operating state, and the activation circuit is further configured to switch the activatable clock generator circuit to the deactivated state when the counter reading of the counter circuit has reached the second counter reading.

14. The memory device of claim 13, further comprising an output unit configured to output data stored in the memory cells of the memory device, wherein stored data are output by the output unit in sync with the clock signal.

15. A memory device comprising:
an activatable clock generator circuit configured to generate a clock signal in an activated state and to suppress generation of the clock signal in a deactivated state, wherein the activatable clock generator circuit comprises a supply connection to supply a supply voltage, and the activatable clock generator circuit is configured to operate in the activated state during a time period after a level of the supply voltage has changed, and the activatable clock generator circuit is further configured to be switched from the activated state to the deactivated state after the time period has elapsed, wherein the memory device is operable in a first operating state and a second operating state, with read access to memory cells of the memory device being facilitated in the first operating state, and a level of the supply voltage applied to the supply connection of the activated clock generator circuit is higher when the memory device is in the second operating state in comparison to the supply voltage applied to the supply connection of the activated clock generator circuit when the memory device is in the first operating state; and
an activation circuit to switch the activatable clock generator circuit between the activated and deactivated states, wherein the activation circuit comprises a counter circuit, the activation circuit is configured to alter the counter reading from a first counter reading until the counter reading has reached a second counter reading after a switch of the memory device from the first operating state to the second operating state, and the activation circuit is further configured to switch the activatable clock generator circuit to the deactivated state when the counter reading of the counter circuit has reached the second counter reading.

16. The memory device of claim 15, further comprising an output unit configured to output data stored in the memory cells of the memory device, wherein stored data are output by the output unit in sync with the clock signal.

17. A method for operating a memory device, the memory device being operable in a first operating state and a second operating state, with read access to memory cells of the memory device being facilitated in the first operating state, the memory device comprising an activatable clock generator circuit that generates a clock signal and is operable in an activated state and a deactivated state, an activation circuit to switch the activatable clock generator circuit between the activated and deactivated states, and an output unit to output data stored in the memory cells, the method comprising:

actuating the memory device with an external clock signal;

operating the memory device in the first operating state and operating the activatable clock generator circuit in the activated state to generate the clock signal;

applying a first level of a control signal to the memory device to switch the memory device from the first operating state to the second operating state;

deactivating the activatable clock generator circuit with the activation circuit after a time period during which the memory device has been operating in the second operating state after being switched from the first operating state to the second operating state, wherein the time period is determined by a counter circuit of the activation circuit which provides a counter reading, the activation circuit is configured to alter the counter reading from a first counter reading until the counter reading has reached a second counter reading after application of the first level of the control signal to switch the memory device from the first operating state to the second operating state, and the activation circuit is further configured to switch the activatable clock generator circuit to the deactivated state when the counter reading of the counter circuit has reached the second counter reading; and applying a second level of the control signal to switch the memory device from the second operating state to the first operating state and to activate the activatable clock generator circuit.

18. The method of claim 17, further comprising:

generating a data item in sync with the clock signal on the output connection of the output unit when the memory device is in the first operating state, the data item having been read from at least one of the memory cells of the memory device.

19. The method of claim 17, wherein the second counter reading is based upon a frequency of the external clock signal.

20. The method as claimed in claim 19, wherein the frequency of the external clock signal is determined by a frequency detector.

21. The method of claim 17, wherein the memory device comprises an integrated semiconductor memory device.

* * * * *